United States Patent [19]
Canella

[11] Patent Number: 6,019,838
[45] Date of Patent: Feb. 1, 2000

[54] CRYSTAL GROWING APPARATUS WITH MELT-DOPING FACILITY

[75] Inventor: Marcello Canella, Merano, Italy

[73] Assignee: MEMC Electronic Materials, Inc., St. Peters, Mo.

[21] Appl. No.: 09/002,592

[22] Filed: Jan. 5, 1998

[51] Int. Cl.[7] ................................................. C30B 15/04
[52] U.S. Cl. ............................. 117/19; 117/30; 117/33; 117/214; 117/218; 117/911
[58] Field of Search ................... 117/19, 30, 33, 117/214, 218, 911

[56] References Cited

U.S. PATENT DOCUMENTS

| | | | |
|---|---|---|---|
| 2,893,847 | 7/1959 | Schweickert et al. | 23/273 |
| 3,829,382 | 8/1974 | Tucker | 252/62.3 R |
| 4,134,785 | 1/1979 | Lavigna et al. | 156/601 |
| 4,556,448 | 12/1985 | Kim et al. | 156/605 |
| 5,034,200 | 7/1991 | Yamashita et al. | 117/19 |
| 5,288,366 | 2/1994 | Holder | 156/617.1 |
| 5,406,905 | 4/1995 | Yemane-Berhane et al. | 117/19 |
| 5,423,283 | 6/1995 | Seki | 117/19 |
| 5,462,011 | 10/1995 | Yomzig et al. | 117/19 |
| 5,488,924 | 2/1996 | Horvath et al. | 117/208 |
| 5,840,115 | 11/1998 | Taguchi et al. | 117/19 |

FOREIGN PATENT DOCUMENTS

| | | |
|---|---|---|
| 0 625 595 A2 | 11/1994 | European Pat. Off. . |
| 59-156993 | 9/1984 | Japan ........ 117/19 |
| 62-153188 | 7/1987 | Japan . |
| 1-153598 | 6/1989 | Japan ....... 117/218 |
| 3-103388 | 4/1991 | Japan ........ 117/19 |
| 5-201790 | 8/1993 | Japan . |
| 8-295591 | 11/1996 | Japan . |
| WO 94/28207 | 12/1994 | WIPO . |
| PCT/US 98/26198 | 12/1998 | WIPO . |

*Primary Examiner*—Robert Kunemund
*Attorney, Agent, or Firm*—Senniger, Powers, Leavitt & Roedel

[57] ABSTRACT

A crystal growing apparatus is able to provide dopant to a melt in the apparatus. A hopper is carrying dopant is integrated into a pull shaft of the apparatus so that dopant can be added to the melt without providing additional orifices in the apparatus or by opening the interior of the apparatus to the atmosphere.

20 Claims, 6 Drawing Sheets

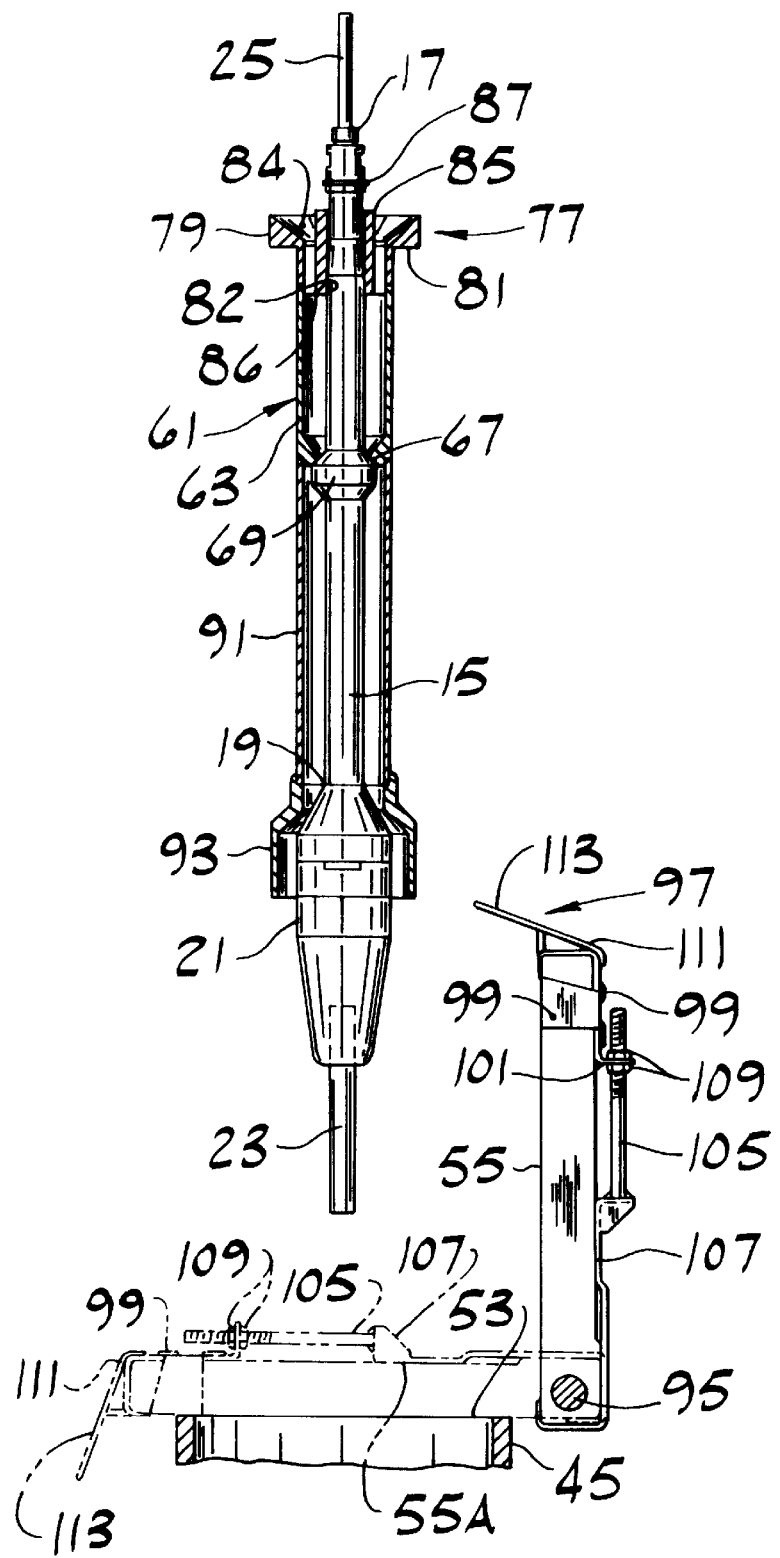

CRYSTAL GROWING APPARATUS WITH MELT-DOPING FACILITY

BACKGROUND OF THE INVENTION

This invention relates to a method and apparatus for the production of doped crystals, and more particularly a method and apparatus for growing doped silicon crystals, especially antimony-doped silicon crystals.

The invention is especially directed to the growing of doped silicon single crystals by the Czochralski process (the "CZ" process), and more particularly to the growing of such crystals with antimony as the dopant.

Reference may be made to U.S. Pat. No. 4,134,785 issued Jan. 16, 1979, U.S. Pat. No. 4,556,448 issued Dec. 3, 1985, and U.S. Pat. No. 5,423,283 issued Jun. 13, 1995 for information re doping generally, and particularly to the last of these three patents for information re doping with antimony involving a method for growing an antimony-doped silicon single-crystal utilizing the CZ process wherein inert gas (argon) is introduced into the crucible chamber and maintained at a pressure in the range of 10–50 millibars, polycrystalline silicon is melted in the crucible in the chamber, and antimony pellets put into the molten silicon (see column 3, lines 41–42 of U.S. Pat. No. 5,423,283. How the antimony pellets are added is not specified.

BRIEF SUMMARY OF THE INVENTION

Among the several objects of this invention may be noted the provision of an improved method and apparatus for the production of relatively highly doped crystals of desired resistivity; the provision of apparatus for production of silicon crystals by the CZ process with doping of the molten silicon melt in the process without pressurization such as above described; the provision of such a method and apparatus for doping the melt with antimony; the provision of such apparatus which facilitates the delivery of dopant into the melt; the provision of such a method and apparatus in which the process of crystal growth may be continued immediately after the doping of the melt (allowing the growth of highly doped silicon single crystals of desired resistivity); and the provision of such a method and apparatus enabling reduction of time for producing the doped crystals.

In general, the method of this invention for growing a doped crystal comprises lowering a seed crystal into a melt of source material, delivering a charge of dopant from a source of the dopant into the melt as the seed crystal is lowered and raising the seed crystal for growing the doped crystal.

In general, crystal growing apparatus of the invention comprises a growth chamber having a crucible therein in which source material for production of a crystal is melted, a pulling chamber above the growth chamber for the pulling of a crystal from the melt in the crucible and a crystal pulling instrumentality having an upper end and a lower end movable between a raised position in the pulling chamber and a lowered position extending down into the growth chamber. The crystal pulling instrumentality has a seed crystal holder at its lower end for holding a seed crystal to be lowered into the melt, means being provided for raising and lowering the pulling instrumentality with the seed crystal. For doping the crystal, the apparatus has a hopper for holding a dopant in a fluent format for delivery of a charge of dopant down into the melt in the crucible, the hopper having a discharge opening, and a closure for the discharge opening normally occupying a closed position blocking the discharge opening for holding dopant in the hopper, and being opened as the pulling instrumentality with the seed crystal is lowered for lowering the seed crystal into the melt to effect the delivery of dopant down into the melt.

Other objects and features will be in part apparent and in part pointed out hereinafter.

BRIEF DESCRIPTION OF THE DRAWINGS

FIG. 2 is a view on a larger scale than FIG. 1 showing the crystal pulling instrumentality in an intermediate position in the course of lowering of the instrumentality wherein the dopant hopper, associated with said instrumentality, is closed and about to be opened for delivery of dopant on slight further lowering, the separation valve being illustrated in its said full open position in solid lines, and in its closed position in phantom;

Corresponding reference characters indicate corresponding parts throughout the several views of the drawings.

DETAILED DESCRIPTION OF THE DRAWINGS

Figure 1:
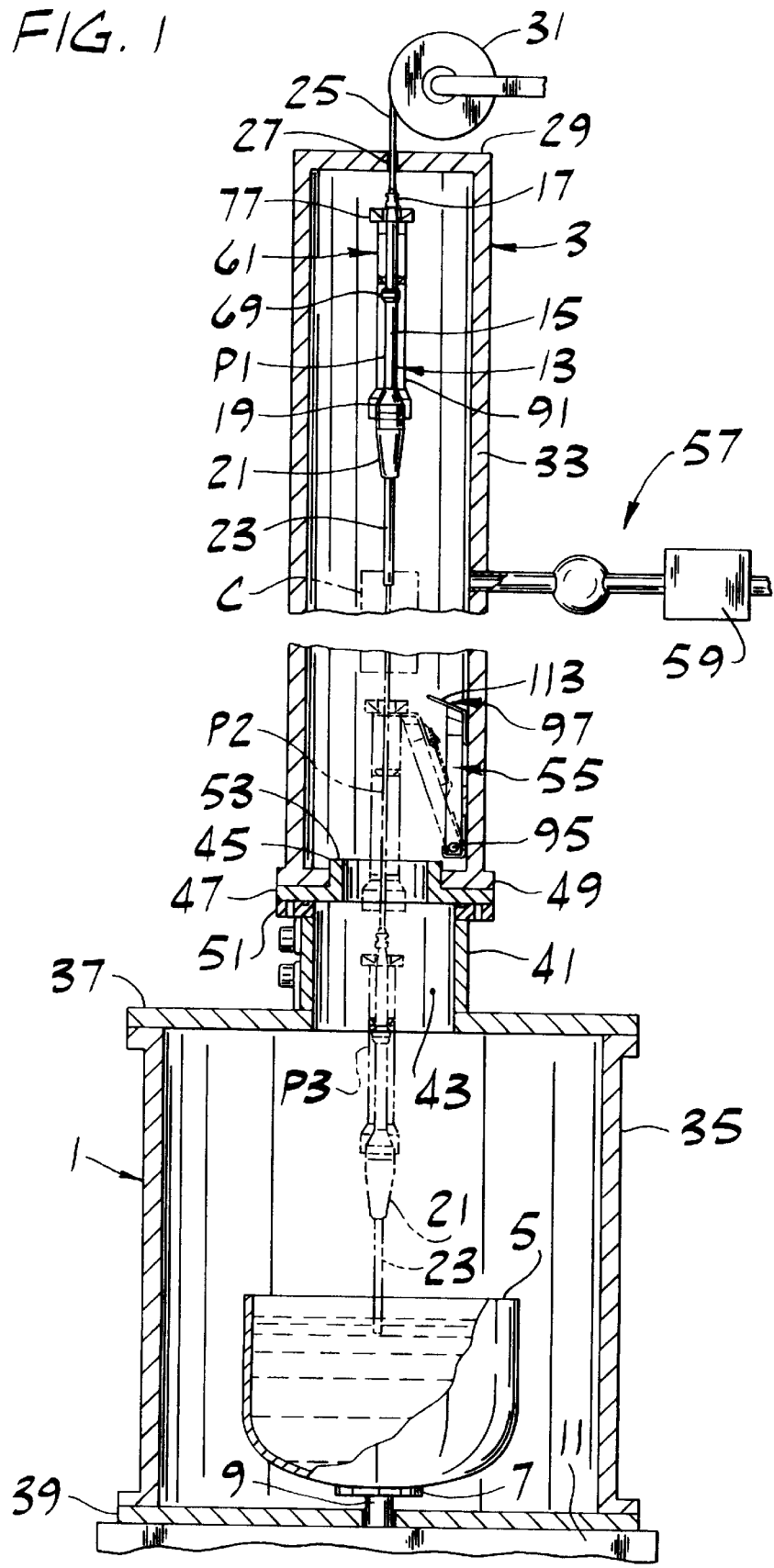
FIG. 1 is a view generally in vertical section, broken away in part to reduce the height of the view, of an apparatus of this invention, showing the crystal pulling instrumentality of the apparatus in a fully raised position thereof in solid lines and in an intermediate position and a lowered position thereof in phantom, also showing a separation valve of the apparatus in a full open position thereof in solid lines and in an intermediate position in phantom; further showing in phantom (broken away in part) a crystal as pulled up by the pulling instrumentality.

Referring to the drawings, first more particularly to FIG. 1, a crystal growing apparatus of this invention which carries out the above-described method for the production of doped crystals, and more particularly the production of silicon single crystals by the Czochralski (CZ) process doped with antimony, is shown to comprise a lower chamber 1 which may be referred to as the growth chamber and an upper chamber 3 which may be referred to as the pulling chamber. Within the growth chamber 1 is a crucible 5 in which source material, e.g. polycrystalline silicon chips, is melted. As well understood in the art, the pulling chamber 3 is for the pulling of a crystal from the melt in the crucible. The crucible is shown as resting on a turntable 7 on the upper end of a vertical shaft 9 extending up into the growth chamber from means indicated diagrammatically at 11 below the growth chamber for rotating the shaft, turntable and crucible, means (not shown) being provided as is conventional for heating the source material to melt it in the crucible.

A crystal pulling instrumentality designated in its entirety by the reference numeral 13 and comprising an elongate shaft or rod 15 which extends vertically in the apparatus, thereby having an upper end 17 and a lower end 19, is movable up and down generally centrally within the two chambers (i.e. on the vertical axis of the chambers) between the raised position in which it is shown in solid lines, indicated at P1 in FIG. 1 wholly within the pulling chamber 3 and the lowered position in which it is shown in phantom indicated at P3 in FIG. 1 extending down into the growth chamber 1. As the pulling instrumentality moves down, it passes through the intermediate position in which it is indicated at P2 in FIG. 1. The rod 15 has a seed crystal holder 21, e.g. a conventional seed crystal chuck, at its lower end for holding a seed crystal 23 to be lowered into the melt as shown in phantom in FIG. 1. The rod is shown as suspended from a cable 25 attached to the upper end 17 of the rod and extending down through an opening 27 in the upper end wall 29 of the pulling chamber 3 from a winch indicated diagrammatically at 31 above the upper end of the pulling chamber, the winch and cable constituting means for raising and lowering the rod 15 with the seed crystal 23 at its lower end. The pulling chamber 3 is vertically elongate, defined by an elongate cylindrical wall 33 and the stated upper end wall 29. As is conventional, a seal (not shown) is provided for sealing against the cable 25 to seal the opening 27.

The growth chamber 1 as herein illustrated has a generally cylindric wall 35, a circular top 37, a circular bottom 39, and a tubular neck 41 of smaller diameter in horizontal cross-section than the top 37 extending up from the top 37 concentric with the chamber, the neck 41 defining a central passage 43 for the lowering of the crystal pulling instrumentality 13 down toward the melt in the crucible 5 and the raising of the crystal pulling instrumentality and the crystal formed at the lower end of the instrumentality up out of the growth chamber and into the pulling chamber 3. At the upper end of the neck 41 is a vertically extending annular valve seat member 45 having an annular flange 47 extending horizontally outward at its lower end sealed in place between the lower end 49 of the elongate cylindrical wall 33 of the pulling chamber and an annular flange structure 51 at the upper end of the neck. The upper end or rim 53 of the vertically extending annular valve seat member 45 serves as a seat for a valve indicated generally at 55, which may be termed an isolation or separation valve for isolating or separating the pulling chamber 3 from the growth chamber 1. This valve 55, which will be hereinafter referred to as the separation valve, is specially constructed and operable in accordance with this invention to serve a dual purpose as will be subsequently described. Suitable provision is made for access to the growth and pulling chambers, as is well understood in the art and thus not shown.

As thus far described, the apparatus corresponds generally to apparatus well-known in the art for production of silicon crystals by the well-known CZ process (with the exception of modification of the separation valve 55), and further involves the provision of means (which includes the special separation valve construction as a control thereof) for doping the molten silicon melt in the crucible 5 with a dopant, more particularly antimony in granular form, in the course of lowering the crystal pulling instrumentality 13 holding the seed crystal 23 down toward the melt. While the dopant is specified as granular antimony, it is contemplated that the invention encompasses doping with other dopants in a fluent format, e.g. in free-flowing particulate form. Provision is made for pulling the crystal and doping under vacuum in the pulling and growth chambers 1 and 3, the pulling chamber 3 being shown as provided with means indicated generally at 57 for drawing a vacuum (with valve 55 open) in both chambers including a vacuum pump 59.

In accordance with this invention, a hopper generally designated 61 is provided for holding a dopant in a fluent format, e.g. granular antimony, for delivery of a charge of dopant down into the melt in the crucible 5. The hopper is shown as comprising a cylindrical tube 63 constituting a cylindrical hopper wall having a circular bottom 65 with a central opening 67 in said bottom 65 constituting a discharge opening for the hopper. The bottom 65 is shown as integral with the wall 63; it could be a separate part. The crystal pulling instrumentality 13 includes a closure 69 for the hopper discharge opening 67 normally occupying a closed position (FIGS. 2 and 2A) blocking the discharge opening for holding dopant in the hopper and being opened, as will appear, as the crystal pulling instrumentality with the seed crystal 23 is lowered for lowering the seed crystal into the melt in the crucible 5 to effect delivery of dopant down into the melt. The bottom 65 of the hopper is shown as having an upwardly flaring upper annular surface 71 around the opening 67 and a downwardly flaring and downwardly facing lower annular surface 735 constituting a downwardly facing valve seat around the opening 67. The closure 69 is formed as an integral collar on the rod 15 shaped to function as a valve for closing the discharge opening 67, and more particularly being shaped to function as a plug for plugging the discharge opening, the valve or plug 69 being movable up and down with the rod, and having an upper annular tapered surface 75 matching the tapered valve seat 73 in the bottom of the hopper for engagement with this seat 73.

Figure 2A:
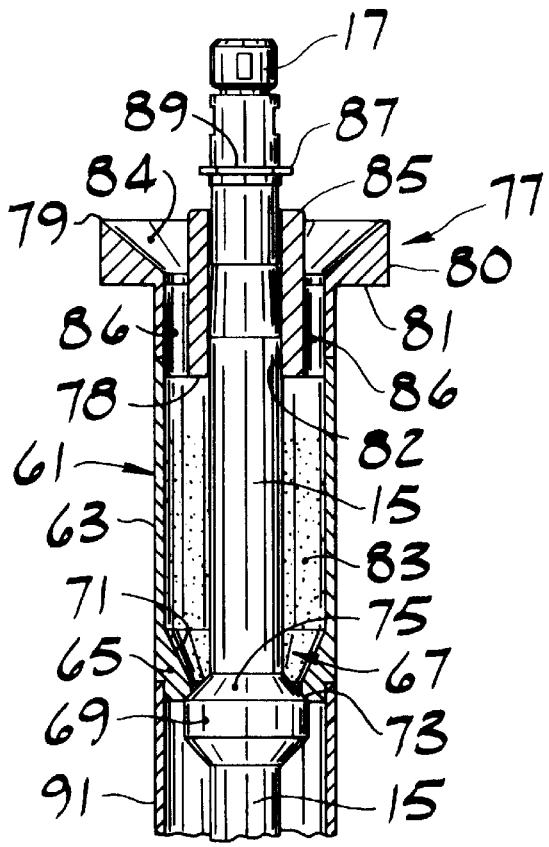
FIG. 2A is an enlarged fragment of FIG. 2 showing a charge of dopant in the hopper.
Figure 4:
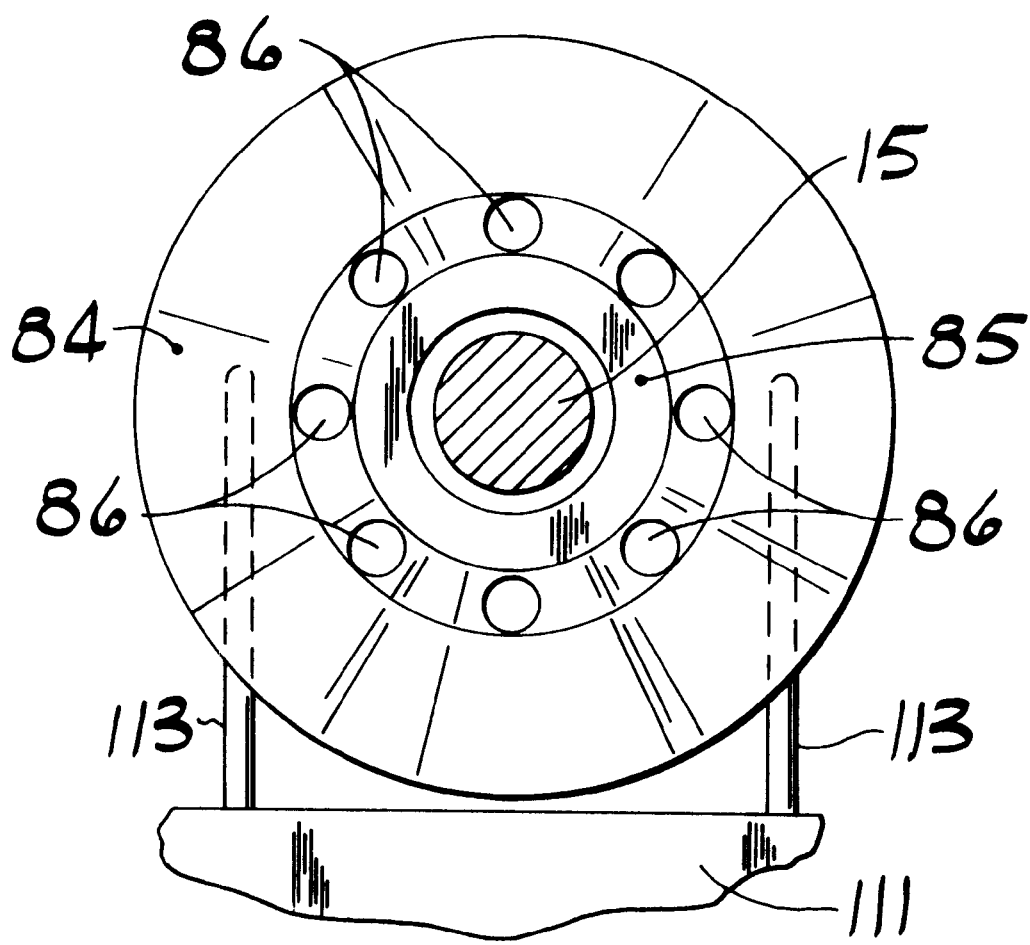
FIG. 4 is an enlarged plan of FIG. 3.

The cylindrical wall 63 of the hopper 61 is of larger diameter than the diameter of the rod 15 and of larger diameter than the valve or plug 69. The latter is formed integrally on the rod 15 a distance from the upper end of the rod greater than the height of the hopper. At its upper end, the hopper has a head 77 having a lower portion 78 of the same diameter as the hopper and an upper portion 79 of larger diameter than the hopper forming a rim 80 presenting a downwardly facing shoulder 81. The head is formed with a central opening 82 slidably receiving the rod 15, thereby mounting the hopper on the rod for up and down sliding movement relative to the rod, the hopper being gravity-biased to slide downward on the rod toward the lowered position relative to the rod in which the valve seat 73 in the bottom 65 of the hopper engages the valve or plug 69 as shown in FIGS. 2 and 2A for closure of the discharge opening 67. The cylindrical wall 63 of the hopper surrounds the rod 15 with space therebetween thereby forming a chamber for holding a charge 83 of the dopant when the discharge opening is plugged. The head 77 has an upwardly flaring or funnel-shaped recess 84 in the top thereof surrounding a central tubular extension 85 and openings 86 extending down from the bottom of this recess which may serve for loading the hopper with the dopant. There may be eight such openings spaced around the head at 45° intervals as appears in FIG. 4.

When the rod 15 is in the raised position in which it is shown in solid lines in FIG. 1, the hopper 61 (under gravity-bias) is in the stated lowered position relative to the rod determined by engagement of the seat 73 at the bottom 65 of the hopper with the tapered surface 75 of the valve or plug 69 (as shown best in FIG. 2A). With the bottom of the hopper thus engaging the valve or plug, the discharge opening 67 is closed for holding the charge 83 of the dopant therein. In the lowering of the rod 15 at the start of a crystal growing operation, the hopper moves down with the rod to a position such as shown in FIG. 2 and just above that shown in FIG. 3. Downward movement of the hopper is then temporarily arrested, by means to be subsequently described, and the hopper temporarily held against moving downward for an interval while the rod continues its downward movement, thereby effecting downward retraction of the valve or plug 55 from the discharge opening for downward delivery of the dopant 83 from the hopper chamber. The rod 11 has a collar 87 lodged in an annular groove 89 adjacent its upper end spaced from the top of the central part 85 of the head 77 when the hopper is in the down position of FIGS. 2 and 2A for closing the discharge opening 67, this collar functioning as a stop limiting the relative movement of the rod and hopper. At 91 is indicated an elongate tubular extension extending down from the bottom of the hopper 61, this extension having an enlarged lower end 93 surrounding the seed crystal holder 21 at the lower end of the rod. This extension acts as a tubular chute for confining dopant dropping down through the discharge opening 67 when the valve or plug 69 opens for the discharge of the dopant to prevent scattering of the dopant.

Figure 5:
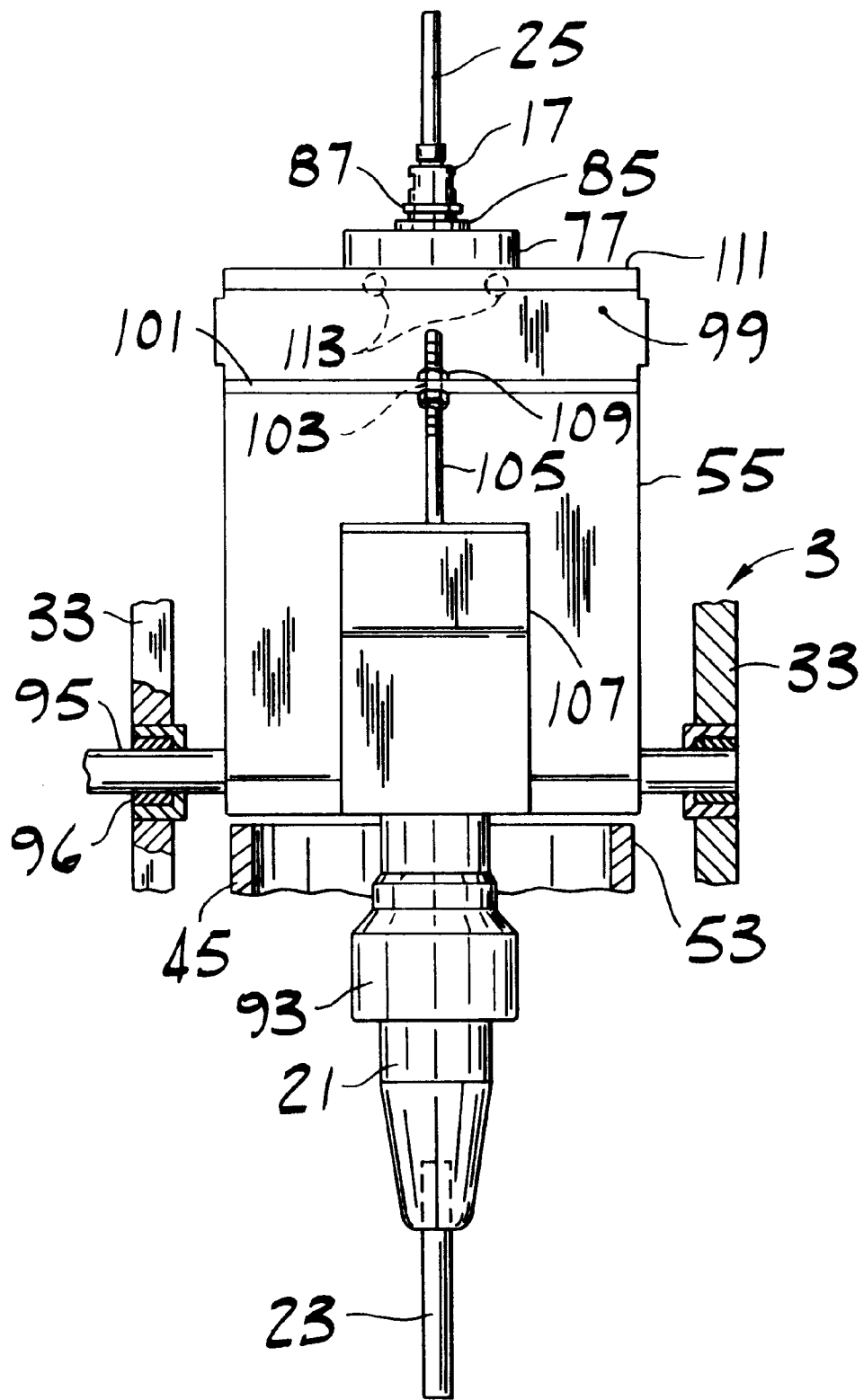
FIG. 5 is a view in elevation taken from the right of FIG. 3 with parts broken away and shown in section.

The aforesaid separation valve 55 is shown as mounted on a rockshaft 95 which extends horizontally transversely of the pulling chamber 3 adjacent the lower end of the pulling chamber for swinging movement on the axis of the shaft between a retracted position clear of the opening in the valve seat member 45 (for the lowering of the pulling instrumentality and the raising thereof with the grown crystal), in which it is illustrated in solid lines in FIGS. 1 and 2, and the closed position indicated in phantom at 55a in FIG. 2 wherein it extends generally horizontally from the said axis and engages the upper end 53 of the valve seat member 45 for isolating the pulling chamber 3 from the growth chamber 1 after the raising of the pulling instrumentality 13 with the grown crystal C hanging down from its lower end to a point wherein the lower end of the crystal is above and clear of the valve 55. The rockshaft 95 extends out of the pulling chamber through a sealed bearing 96 (see FIG. 5) and is rotatable for the opening and closing of the valve 55 as will be readily understood. The rockshaft is also rotatable through a small angle to swing the valve 55 away from its retracted position to the intermediate position in which it is shown in solid lines in FIG. 3 and in phantom in FIG. 1, which may be referred to as its hopper stop position, wherein stop means generally designated 97 on the valve is in position for arresting the downward movement of the hopper 61 while the rod 15 continues its descent and the valve or plug 69 moves down away from the hopper bottom to unblock the hopper discharge opening 57 for delivery of dopant down into the melt in crucible 5. The separation valve 55 is shown as comprising a generally flat rectangular valve member fixed at one end on the rockshaft 95 extending radially therefrom, and of such length and width as to completely close off the opening through the annular valve seat member 45 when it is swung down to horizontal position engaging the rim 53 of the valve seat. Adjustably slidable lengthwise of the valve member (i.e. in the direction toward and the direction away from the rockshaft) adjacent the free end of the valve member is a slide generally designated 99 comprising a plate slidable on the outer face of the valve member having a flange 101 at an edge thereof toward the rockshaft extending transversely with respect to the valve member. This flange has a hole 103 therein receiving the threaded end of a rod 105 extending lengthwise with respect to the valve member 55 from a fixture 107 mounted on the valve member. Nuts 109 threaded on the rod on opposite sides of the flange 101 hold the slide in adjusted position on the valve member. At its edge away from the rockshaft, the slide 97 has a flange 111 extending at an obtuse angle with respect to the valve member 55 in the opposite direction from the flange 101. Projecting out from the flange 111 at the same angle as this flange are two pins each designated 113 constituting the stop means 97 for arresting the hopper 61 as it moves downward with the crystal pulling instrumentality 13 during its downward movement. These stop pins or fingers 113 extend out from the flange 111 in parallel spaced-apart relation on opposite sides of a vertical central plane of the hopper 61 spaced apart a distance greater than the outside diameter of the hopper but less than the outside diameter of the head 77 of the hopper, the arrangement being such that when the separation valve 55 is moved to the intermediate position thereof shown in FIG. 3, the stop fingers extend generally horizontally on opposite sides of the hopper thereby straddling the hopper under the rim 79 of the head of the hopper for engagement by the downwardly facing shoulder 81 of the rim. Suitable indexing mechanism (not shown) may be provided for the indexing of the rockshaft to index the separation valve 55 to its different positions.

At the start of the operation of growing a doped crystal C the separation valve 55 is in its retracted open position shown in solid lines in FIGS. 1 and 2, clear of the passage through the annular valve seat 45. The crystal pulling rod 15, holding a seed crystal 23 at its lower end, is up in a raised position such as the position P1 shown in FIG. 1. The hopper 61 is in the lowered position relative to the rod 15 in which it is shown in FIGS. 2 and 2A, the hopper discharge opening 67 thereby being closed by the valve or plug 69 on the rod, with a charge 83 of dopant (e.g. granulated antimony) held in the hopper. The growth and pulling chambers 1 and 3 are closed and under vacuum.

With source material, e.g. polycrystalline silica, having been melted in the crucible 5 in the growth chamber 1, the rod 15 and the charged hopper 61 thereon, with the seed crystal 23 chucked in the chuck 21 at the lower end of the rod, are lowered down toward the melt in the crucible. Either before or as the rod/hopper assembly 15, 61 is lowered, the separation valve 55 is swung, either manually or under suitable automatic control, from the retracted position in which it is shown in solid lines in FIGS. 1 and 2 to the hopper-intercepting intermediate position in which it is shown in solid lines in FIG. 3 and in phantom in FIG. 1 wherein the stop fingers 113 on the separation valve extend generally horizontally on opposite sides of the hopper straddling the hopper and underlying the shoulder 81 presented by the rim of the head of the hopper. The lowering of the rod/hopper assembly is continued until the shoulder 81 presented by the rim of the head of the hopper engages the stop fingers, arresting the downward movement of the hopper and stopping it in the position shown in FIG. 3. With the hopper so held against downward movement, lowering of the rod 15 is continued to the point where the rod has moved down within the hopper to the limit imposed by the stop collar 87 with resultant withdrawal of the valve or plug 55 on the rod from the hopper bottom to unblock the discharge opening 57 for gravity delivery of the dopant 83 from the hopper down into the melt in the crucible 5. As the dopant is discharged through the opening 57 and around the valve or plug, it is confined in the tubular chute 91 against scattering, dropping out of the chute 91 around the seed crystal chuck 21 down into the melt.

Figure 3A:
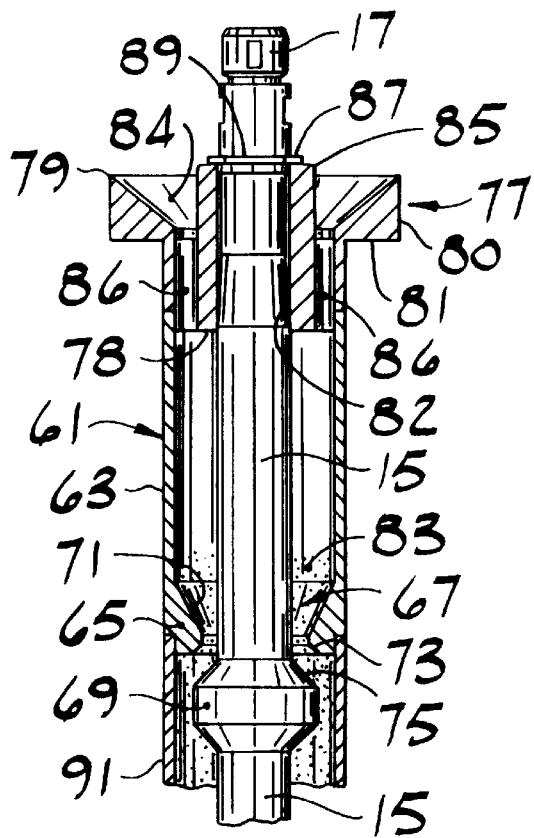
FIG. 3A is an enlarged fragment of FIG. 3.
Figure 3:
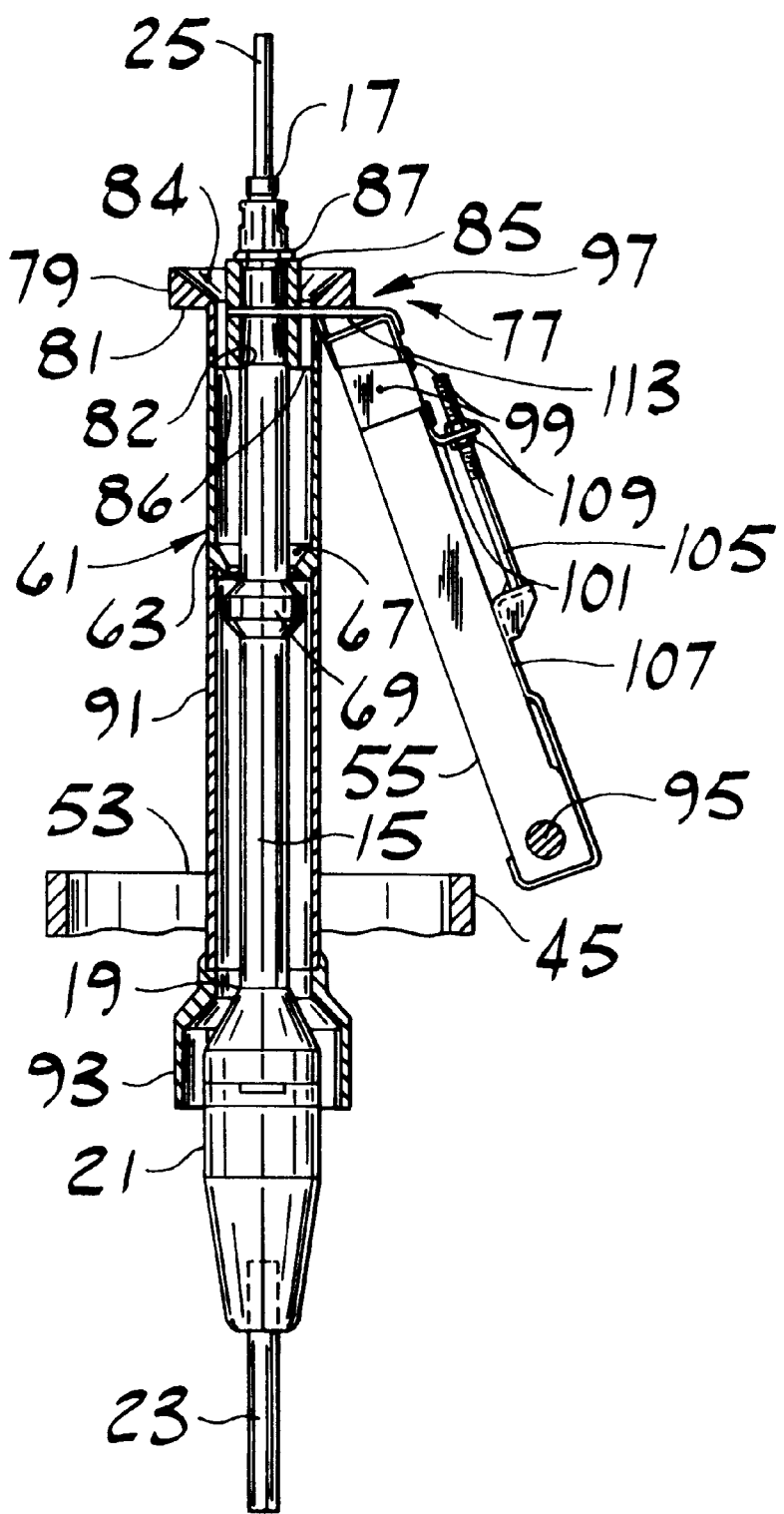
FIG. 3 is a view similar to FIG. 2 showing in solid lines the separation valve in its said intermediate position wherein it effects opening of the hopper, and showing the hopper open for delivery of dopant.

The hopper is held in its FIG. 3 position for a time sufficient for delivery of the dopant and the separation valve 55 is then swung back to its retracted position (its FIG. 2 solid line position) wherein fingers 113 are out from under the head 77 of the hopper. The hopper drops down on the rod 15 until the lower end of the hopper again engages the valve or plug 55, and lowering of the rod 15 (and the closed hopper) is continued for entry of the seed crystal 23 in the melt in the crucible. The rod 15 (and the closed hopper) are then raised for growing the doped crystal C, pulling the crystal up to the position in the pulling chamber in which it is indicated in phantom in FIG. 1, carrying out the CZ crystal growing process, as will be readily understood in the art. With the crystal in the raised position in the pulling chamber shown in phantom in FIG. 1, the separation valve 55 may be closed to isolate the pulling chamber, in accordance with conventional practice in the art.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. The method of growing a doped crystal comprising providing crystal pulling instrumentality movable between a raised and lowered position and having a seed crystal holder holding a seed crystal at a lower end of the pulling instrumentality, providing a hopper holding dopant in a fluent format, said hopper having a discharge opening and a closure for said discharge opening movable between an open position for releasing dopant from the hopper and a closed position for blocking said discharge opening to hold dopant in the hopper, lowering the seed crystal and hopper toward a melt of source material, actuating the hopper closure as the seed crystal and hopper are lowered toward the melt to move to the open position for delivering a charge of dopant from the hopper into the melt, and raising the seed crystal for growing the doped crystal.

2. The method of claim 1 wherein the lowering of the seed crystal, the delivery of the charge of dopant and the raising of the seed crystal are carried out in a vacuum.

3. The method of claim 2 wherein the charge of dopant is delivered from a source directly above the melt as the seed crystal is lowered.

4. The method of claim 3 wherein the charge of dopant is delivered in response to the lowering of the seed crystal.

5. A crystal growing apparatus for production of crystals comprising a growth chamber having a crucible therein in which source material for production of a crystal is melted; a pulling chamber above the growth chamber for the pulling of a crystal from the melt in the crucible; crystal pulling instrumentality having an upper end and a lower end movable up and down between a raised position in the pulling chamber and a lowered position extending down into the growth chamber; said crystal pulling instrumentality having a seed crystal holder at its lower end for holding a seed crystal to be lowered into the melt; and means for raising and lowering said pulling instrumentality with the seed crystal held thereby; characterized in further having:

a hopper for holding a dopant in a fluent format for delivery of a charge of dopant down into the melt in the crucible; said hopper having a discharge opening and a closure for said discharge opening normally occupying a closed position blocking said discharge opening for holding dopant in the hopper and being opened as said pulling instrumentality with the seed crystal is lowered for lowering the seed crystal into the melt to effect the delivery of dopant down into the melt.

6. Apparatus as set forth in claim 5 wherein the hopper is carried by said pulling instrumentality.

7. Apparatus as set forth in claim 6 wherein the hopper is carried by said pulling instrumentality for up and down movement with said pulling instrumentality and for up and down movement relative to said pulling instrumentality, said closure being movable with said pulling instrumentality and being movable to open position upon downward movement of the crystal pulling instrumentality relative to the hopper.

8. Apparatus as set forth in claim 7 wherein said pulling instrumentality comprises a rod having said seed holder at its lower end, said raising and lowering means being attached to the upper end of the rod, said closure comprising a valve for closing the discharge opening of the hopper, said valve being movable up and down with said rod, said hopper having a bottom with said discharge opening therein and being seated at its bottom on the valve around said discharge opening for closing said discharge opening, said apparatus having stop means for holding the hopper against downward movement while the rod continues its downward movement and the valve moves down with the rod to open position for delivery of the dopant, said stop means being movable from a retracted position clear of the hopper to a stop position in the path of the hopper.

9. Apparatus as set forth in claim 8 wherein the hopper comprises a wall surrounding the rod forming with the bottom of the hopper and the valve when closed a chamber for holding a charge of the dopant, and wherein the hopper has a projection extending radially outward therefrom for engagement with said stop means.

10. Apparatus as set forth in claim 9 wherein said hopper is cylindrical, and said projection is constituted by a head on the upper end of the hopper having a central opening slidably receiving the rod.

11. Apparatus as set forth in claim 10 having a tubular extension extending down from the bottom of the hopper surrounding the rod, said tubular extension having an enlarged lower end surrounding the seed crystal holder at the lower end of the shaft.

12. Apparatus as set forth in claim 8 wherein the discharge opening has a downwardly facing lower annular surface therein and said valve is shaped to function as a plug engageable with said downwardly facing surface.

13. Apparatus as set forth in claim 12 wherein the hopper comprises a wall surrounding the rod forming with the bottom of the hopper and the valve when closed a chamber for holding a charge of the dopant, and wherein the hopper has a projection extending radially outward therefrom for engagement with said stop means.

14. Apparatus as set forth in claim 13 wherein said hopper is cylindrical, and said projection is constituted by a head on the upper end of the hopper having a central opening slidably receiving the rod.

15. Apparatus as set forth in claim 14 having a tubular extension extending down from the bottom of the hopper surrounding the rod, said tubular extension having an enlarged lower end surrounding the seed crystal holder at the lower end of the shaft.

16. Apparatus as set forth in claim 8 having a separation valve seat and a separation valve movable from a retracted position clear of a crystal being pulled up into the pulling chamber and a closed position against the separation valve seat for isolating the pulling chamber from the growth chamber after the crystal has been pulled up, said stop means being carried by said separation valve and movable with the separation valve, said stop means occupying its stop position when the separation valve is moved to a position intermediate its retracted and closed positions.

17. Apparatus as set forth in claim 16 wherein the hopper comprises a wall surrounding the rod forming with the bottom of the hopper and the valve when closed a chamber for holding a charge of the dopant, and wherein the hopper has a projection extending radially outward therefrom for engagement with said stop means, wherein said hopper is cylindrical, said projection is constituted by a head on the upper end of the hopper having a central opening slidably receiving the rod, said stop means underlying said head when the separation valve is moved to said intermediate position.

18. Apparatus as set forth in claim 17 wherein said stop means comprises a pair of fingers extending from the separation valve which straddle the hopper when the separation valve is moved to said intermediate position.

19. Apparatus as set forth in claim 18 wherein the stop fingers extend from a part adjustably mounted on the separation valve.

20. Apparatus as set forth in claim 19 wherein the separation valve is pivoted for swinging movement on an axis extending transversely with respect to said pulling chamber, and said part carrying the stop fingers is adjustable on the separation valve in the direction toward and the direction away from said axis.

* * * * *